US009059385B2

(12) United States Patent
Yoon

(10) Patent No.: US 9,059,385 B2
(45) Date of Patent: Jun. 16, 2015

(54) LIGHT EMITTING DEVICE PACKAGE

(75) Inventor: JaeJoon Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 271 days.

(21) Appl. No.: 13/173,396

(22) Filed: Jun. 30, 2011

(65) Prior Publication Data

US 2012/0001216 A1 Jan. 5, 2012

(30) Foreign Application Priority Data

Jul. 1, 2010 (KR) .................. 10-2010-0063563

(51) Int. Cl.
H01L 33/48 (2010.01)
H01L 33/62 (2010.01)
H01L 25/075 (2006.01)
H01L 25/16 (2006.01)
H01L 33/64 (2010.01)

(52) U.S. Cl.
CPC ............. H01L 33/62 (2013.01); H01L 25/0753 (2013.01); H01L 25/167 (2013.01); H01L 33/647 (2013.01); H01L 2224/48 (2013.01); H01L 33/486 (2013.01)

(58) Field of Classification Search
None
See application file for complete search history.

(56) References Cited

U.S. PATENT DOCUMENTS

| 5,387,762 A | 2/1995 | Hasegawa et al. | 174/52.4 |
| 5,629,239 A * | 5/1997 | DiStefano et al. | 216/14 |
| 6,486,543 B1 * | 11/2002 | Sano et al. | 257/684 |
| 2001/0022390 A1 | 9/2001 | Waitl et al. | 257/666 |
| 2003/0189236 A1 * | 10/2003 | Arndt | 257/433 |
| 2004/0069999 A1 * | 4/2004 | Lin et al. | 257/88 |
| 2007/0183159 A1 * | 8/2007 | Maeta et al. | 362/362 |
| 2008/0041625 A1 * | 2/2008 | Cheong et al. | 174/521 |
| 2008/0043477 A1 * | 2/2008 | Yamamoto et al. | 362/362 |
| 2008/0054287 A1 * | 3/2008 | Oshio et al. | 257/99 |
| 2008/0132002 A1 * | 6/2008 | Inao et al. | 438/116 |
| 2008/0225532 A1 | 9/2008 | Kokubu et al. | 362/368 |
| 2009/0050925 A1 | 2/2009 | Kuramoto et al. | 257/100 |
| 2009/0283781 A1 * | 11/2009 | Chan et al. | 257/89 |
| 2011/0199787 A1 * | 8/2011 | Kim et al. | 362/612 |
| 2011/0248293 A1 * | 10/2011 | Chan et al. | 257/89 |

FOREIGN PATENT DOCUMENTS

| JP | 63-199447 A | 8/1988 |
| JP | 2002-314138 | 10/2002 |
| JP | 2008-198807 | 8/2008 |
| JP | 2009-188201 | 8/2009 |
| WO | WO 2006/083110 A1 | 8/2006 |
| WO | WO 2009/051093 A1 | 4/2009 |
| WO | WO2010/002226 A2 * | 7/2010 |

OTHER PUBLICATIONS

European Search Report dated May 8, 2014 issued in Application No. 11 172 315.1.

* cited by examiner

Primary Examiner — Fei Fei Yeung Lopez
(74) Attorney, Agent, or Firm — KED & Associates, LLP

(57) ABSTRACT

A light emitting device package is provided comprising a light emitting device including at least one light emitting diode and a body including a first lead frame on which the light emitting device is mounted and a second lead frame spaced apart from the first lead frame, wherein at least one of the first and second lead frames is extending to a bending region in a first direction by a predetermined length on the basis of an outer surface of the body and is bent in a second direction intersecting the first direction.

20 Claims, 9 Drawing Sheets

LIGHT EMITTING DEVICE PACKAGE

CROSS-REFERENCE TO RELATED APPLICATION

This application claims the priority benefit of Korean Patent Application No. 10-2010-0063563, filed on in Korea Jul. 1, 2010, the disclosure of which is incorporated herein by reference.

BACKGROUND OF THE EMBODIMENT

1. Technical Field

This relates to a light emitting device package.

2. Discussion of the Related Art

A light emitting device may include, for example, a light emitting diode (LED) including a semiconductor device which converts electrical energy into light.

A side view type light emitting device package including light emitting devices includes a compact and slim body. Such a light emitting device package has been utilized in laptop computers, monitors, televisions, and various other display devices.

The slim body of the side view type light emitting device package, however, may problematically limit the size and number of mountable light emitting devices.

Further, the body of the light emitting device package or a resin material charged in the body may be easily thermally degraded by heat and light because of the compact size of the body.

When the light emitting device package is reduced in size, furthermore, the size of the body as well as the size and thickness of a lead frame are limited.

In recent years, studies to prevent damage to the body of the light emitting device package when the lead frame is bent toward an outer surface of the body have been progressed.

SUMMARY OF THE EMBODIMENT

Embodiments provide a light emitting device package which can efficiently prevent damage thereto upon bending of a lead frame.

According to an embodiment, there is provided a light emitting device package comprising a light emitting device including at least one light emitting diode and a body including a first lead frame on which the light emitting device is mounted and a second lead frame spaced apart from the first lead frame, wherein at least one of the first and second lead frames is extending to a bending region in a first direction by a predetermined length on the basis of an outer surface of the body and is bent in a second direction intersecting the first direction.

According to another embodiment, there is provided a light emitting device package comprising a light emitting device including at least one light emitting diode and a body including a first lead frame on which the light emitting device is mounted and a second lead frame spaced apart from the first lead frame, wherein an outer surface of the body and is bent in a second direction intersecting the first direction, and wherein the body provides inner surfaces adjacent to the light emitting device, and at least one of the first and second inner surfaces of the inner surfaces is provided with an extension which extends in a direction toward the light emitting device and comes into contact with an upper portion of at least one of the first and second lead frames.

According to the embodiments, bending of a lead frame provided at a light emitting device package is performed in such a manner that the lead frame is extended outward beyond an outer surface of a package body and then, is subjected to bending so as to be level with the outer surface of the body, which may advantageously minimize damage to the body upon bending of the lead frame.

Further, according to the embodiments, light emitting devices are disposed on the lead frame so as to be aligned on a longitudinal center axis of the body, which may enhance luminance uniformity of light emitted from a small light emitting device package.

BRIEF DESCRIPTION OF THE DRAWINGS

The embodiments will be described in detail with reference to the following drawings in which like reference numerals refer to like elements wherein.

DETAILED DESCRIPTION OF THE EXEMPLARY EMBODIMENTS

Figure 1:
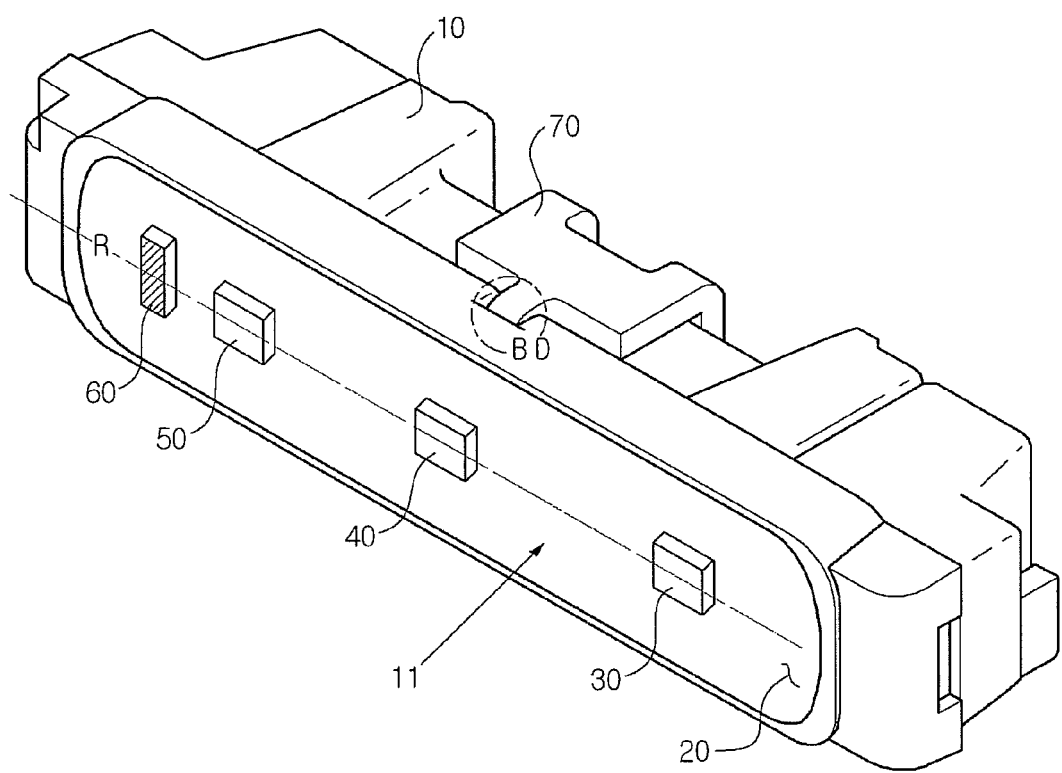
FIG. 1 is a top perspective view illustrating a light emitting device package in accordance with a first embodiment.

Hereinafter, exemplary embodiments will be described in detail with reference to the accompanying drawings, wherein the same reference numerals are used to denote the same or substantially the same devices throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the devices in the drawings do not thoroughly reflect real sizes of devices.

Angles and directions described herein are based on those shown in the drawings. Reference points of angles and locations of LED array structures, which are not clearly described herein, are based on those shown in the drawings.

Figure 2:
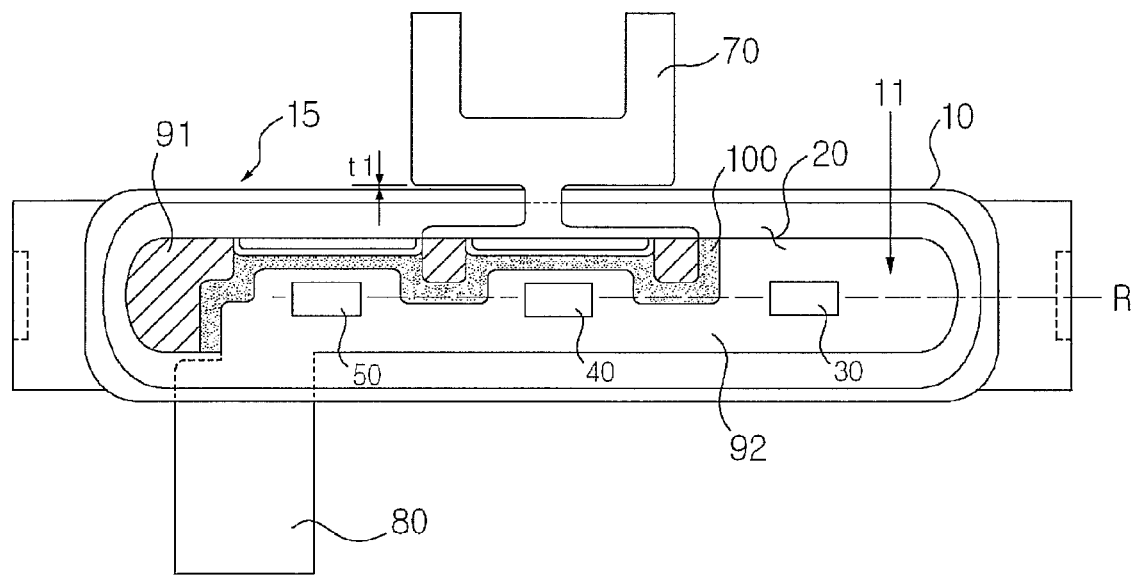
FIG. 2 is a plan view illustrating a configuration of lead frames included in the light emitting device package illustrated in FIG. 1.
Figure 3:
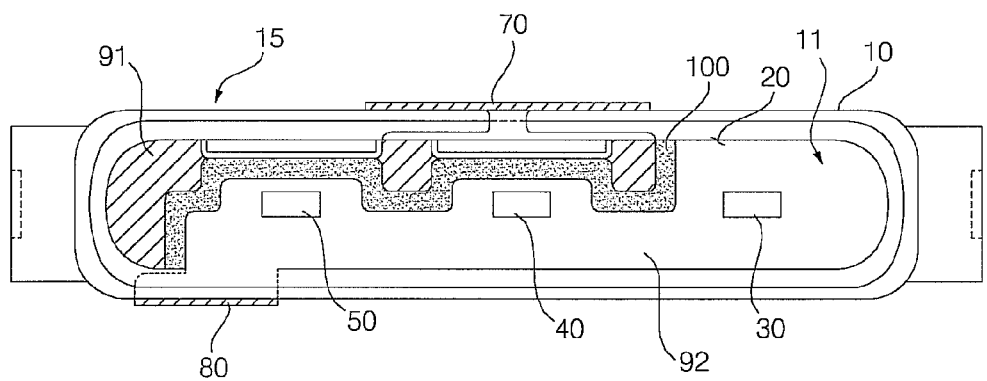
FIG. 3 is a plan view illustrating a state in which the lead frames are bent toward outer surfaces of a body of the light emitting device package illustrated in FIG. 1.

FIG. 1 is a top perspective view illustrating a light emitting device package in accordance with a first embodiment, FIG. 2 is a plan view illustrating a configuration of lead frames included in the light emitting device package illustrated in FIG. 1, and FIG. 3 is a plan view illustrating a state in which the lead frames are bent toward outer surfaces of a body of the light emitting device package illustrated in FIG. 1.

Referring to FIGS. 1 to 3, the light emitting device package includes light emitting devices 30, 40 and 50, and a body 10 including a first lead frame 92 on which the light emitting devices 30, 40 and 50 are disposed and a second lead frame 91 separated from the first lead frame 92, the body 10 internally defining a cavity 20 on the first and second lead frames 92 and 91.

The plurality of light emitting devices 30, 40 and 50 may be disposed on the first lead frame 92 and be aligned on a center longitudinal axis R of the body 10.

An electrostatic discharge (ESD) device 60, which is resistant to external ESD shock, may be provided to prevent damage to the light emitting devices 30, 40 and 50.

In this case, the ESD device 60 may be connected in parallel to at least one of the light emitting devices 30, 40 and 50.

When providing the plurality of light emitting devices 30, 40 and 50, it is possible to reduce the size, light quantity and heat emission of each light emitting device, as compared to providing the first lead frame 92 with a single light emitting device (not shown).

For example, if a single 0.3 W level light emitting device is disposed to the first lead frame 92, the size, light quantity and heat emission of the 0.3 W level light emitting device must be greater than those of a 0.1 W level light emitting device.

When replacing the single 0.3 W level light emitting device with three 0.1 W level light emitting devices, the light quantity and heat emission of each light emitting device are approximately one third those of the 0.3 W level light emitting device.

The above description will be clearly understood under the assumption that the same manufacturer makes the different kinds of light emitting device packages using the same technology.

In the embodiment, accordingly, the plurality of light emitting devices 30, 40 and 50, each having a relatively low capacity, may be disposed on the first lead frame 92 so as to be arranged at a predetermined interval along the center axis R.

With this configuration, light and heat generated by the light emitting devices 30, 40 and 50 may be uniformly distributed throughout the cavity 20, which can minimize thermal degradation of the body 10, the cavity 20 or a resin material (not shown) charged in the cavity 20.

The cavity 20 has an opening through which light emitted from the light emitting devices 30, 40 and 50 is directed to the outside. The resin material may be charged into the cavity 20 to isolate the light emitting devices 30, 40 and from the outside or to change properties of light emitted from the light emitting devices 30, 40 and 50.

The resin material may includes at least one of a phosphor and a light diffusive material.

The resin material may contain a single phosphor or two or more phosphors according to the wavelength of light emitted from the light emitting devices 30, 40 and 50.

Alternatively, the resin material may include a first resin material (not shown) containing a phosphor and a second resin material not containing a phosphor, which are layered one above another within the cavity 20.

For example, if the light emitting devices 30, 40 and 50 are adapted to emit blue light and the light emitting device package in accordance with the embodiment requires to emit white light, the resin material may contain a yellow phosphor. Of course, the phosphor contained in the resin material may be determined according to a desired wavelength of light to be emitted from the light emitting device package.

The light emitting devices 30, 40 and 50 may be commonly connected to the single ESD device 60.

The ESD device 60 may protect the light emitting device in accordance with the embodiment from excessive voltage, surges, static electricity, and other noise.

The ESD device 60 may be a Zener diode, a Varistor, or a Transient Voltage Suppression (TVS) diode. In the embodiment, the single ESD device 60 is disposed on the second lead frame 91.

The light emitting devices 30, 40 and 50 have commonly connected anode terminals and commonly connected cathode terminals.

Specifically, the anode terminal of the light emitting device 30, the anode terminal of the light emitting device 40, and the anode terminal of the light emitting device 50 have a common connection. Similarly, the cathode terminals of the light emitting devices 30, 40 and 50 have a common connection.

The ESD device 60 is connected to a common anode terminal of the light emitting devices 30, 40 and 50, e.g., to the second lead frame 91 and is also connected to a common cathode terminal of the light emitting devices 30, 40 and 50, e.g. to the first lead frame 92. With this connection, the area of the ESD device 60 can be minimized as compared to a conventional ESD device connection method in which an ESD device is connected to each of a plurality of light emitting devices.

As described above, in the light emitting device package in accordance with the embodiment, the three light emitting devices 30, 40 and 50 may be disposed on the first lead frame 92 and the single ESD device 60 may be disposed on the second lead frame 91.

The first lead frame 92 may include a lower electrode 80, which is exposed to the outside of the body 10 and corresponds to the common cathode terminal of the light emitting devices 30, 40 and 50. The second lead frame 91 may include an upper electrode 70, which is exposed to the outside of the body and corresponds to the common anode terminal of the light emitting devices 30, 40 and 50.

The upper electrode 70 is exposed from a longitudinal upper surface of the body 10, so as to emit a part of heat generated by the light emitting devices 30, 40 and 50 to the air. The lower electrode 80 is adapted to emit heat through a printed circuit board (not shown), which is electrically connected to the lower electrode 80 when the light emitting device package in accordance with the embodiment is soldered to the printed circuit board (not shown).

A partial region of the upper electrode 70 is embedded in the cavity 20 and is connected to any one of the anode terminals or the cathode terminals of the respective light emitting devices 30, 40 and 50. The remaining region of the upper electrode 70 exposed to the outside of the body 10 is bent toward a longitudinal outer surface 15 of the body 10.

In this case, if a bending region BD of the upper electrode 70 does not sufficiently underpin the body 10, for example, if the upper electrode 70 fails to underpin the body 10 thus causing the body 10 to become detached from the upper electrode 70, the body 10 may crack due to a gap between the body 10 and the upper electrode 70.

In addition, since the bending region BD of the upper electrode 70 is bent about the body 10 serving as a fulcrum, a portion of the body 10 coming into contact with the bending region BD may be damaged or depressed, or may crack upon bending of the upper electrode 70.

To prevent the depression or cracking of the body 10 at the bending region BD of the upper electrode 70, it is preferable that the upper electrode 70 be extended outward beyond the outer surface 15 of the body 10, prior to being bent toward the outer surface 15 of the body 10.

And at least one of the first and second lead frames 92 and 91 is bent by a bending angle (not shown) with respect to the outer surface 15 of the body 10 and the bending angle is in a range of 30 degrees to 90 degrees.

In FIG. 2, the upper electrode 70 is illustrated as being extended outward beyond the outer surface 15 of the body 10 by a predetermined length t1. Thereafter, as illustrated in FIG. 3, the upper electrode 70 may be bent toward the outer surface 15.

In a state in which the upper electrode 70 is bent toward the outer surface 15 of the body 10, an inner surface of the upper electrode 70 is preferably level with the outer surface 15 of the body 10, and an outer surface of the upper electrode 70 is preferably raised outward of the outer surface 15 of the body 10.

The predetermined length t1 of the upper electrode 70 on the basis of the outer surface 15 of the body 10 may be determined based on a thickness of the upper electrode 70.

In the embodiment, the predetermined length t1 of the upper electrode 70 on the basis of the outer surface 15 may be 0.7 times to 0.9 times the thickness of the upper electrode 70.

For example, if it is assumed that the thickness of the upper electrode 70 is 1 mm, the upper electrode 70 is extended from the outer surface 15 by the predetermined length t1 of 0.7 mm to 0.9 mm and then, is bent toward the outer surface 15 so as to come into close contact with the outer surface 15 as illustrated in FIG. 3.

Applying the rate of 0.7 times to 0.9 times the thickness of the upper electrode 70 is to allow the upper electrode 70 to be extended from the outer surface 15 in proportion to the thickness of the upper electrode 70.

That is, the predetermined length t1 is determined in consideration of the fact that the greater the thickness of the upper electrode 70, the greater a distance between an inner surface and an outer surface of the bending region BD of the upper electrode 70.

Accordingly, in the embodiment, in consideration of the increased distance between the inner surface and the outer surface of the bending region BD, instead of directly bending the upper electrode 70 at the outer surface 15 of the body 10, the upper electrode 70 is extended from an interface between the upper electrode 70 and the body 10 by the predetermined length t1 of 0.7 times to 0.9 times the thickness of the upper electrode 70, prior to being bent toward the outer surface 15 of the body 10. This allows the inner surface of the upper electrode 70 to come into close contact with the body 10 without a gap and also, prevents damage to the body 10 caused when the upper electrode 70 applies excessive force to the body 10.

FIGS. 1 to 3 illustrate an operation of bending the upper electrode 70 toward the body 10. However, of course, it will be appreciated that the lower electrode 80 may also be bent toward the body 10 in the same manner as the upper electrode 70.

Similarly, the lower electrode 80 may be extended from an interface between the lower electrode 80 and the body 10 by a length of 0.7 times to 0.9 times a thickness of the lower electrode 80 and then, be bent toward a corresponding outer surface of the body 10. A description thereof will be replaced by the bending operation of the upper electrode 70.

Referring again to FIG. 2, the three light emitting devices 30, 40 and 50 may be arranged on the center axis R of the first lead frame 92, the second lead frame 91 may be arranged at the upper side of the light emitting devices 30, 40 and 50, and the first lead frame 92 may be arranged at the lower side of the light emitting devices 30, 40 and 50.

The second lead frame 91 may be any one of the common anode terminal and the common cathode terminal of the light emitting devices 30, 40 and 50, and the first lead frame 92 may be the other one of the common anode terminal and the common cathode terminal of the light emitting devices 30, 40 and 50.

Assuming that the light emitting devices 30, 40 and 50 respectively have an anode terminal and a cathode terminal, the anode terminals and the cathode terminals of the light emitting devices 30, 40 and 50 may be commonly connected respectively to the first lead frame 92 and the second lead frame 91.

An insulating dam 100 may be provided between the second lead frame 91 and the first lead frame 92 to electrically insulate the lead frames 91 and 92.

Although not illustrated in the drawings, the second lead frame 91 and the first lead frame 92 with the insulating dam 100 interposed therebetween may be provided respectively with a plurality of pads (not shown) for electrical connection of the light emitting devices 30, 40 and 50 and the ESD device 60, such as a Zener diode. This will be described later in detail with reference to the drawings.

Figure 4:
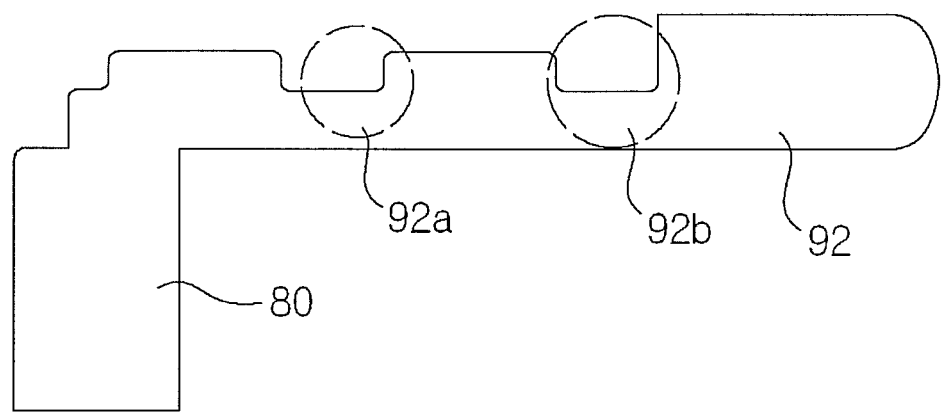
FIG. 4 is a view illustrating a configuration of a first lead frame illustrated in FIG. 1.
Figure 5:
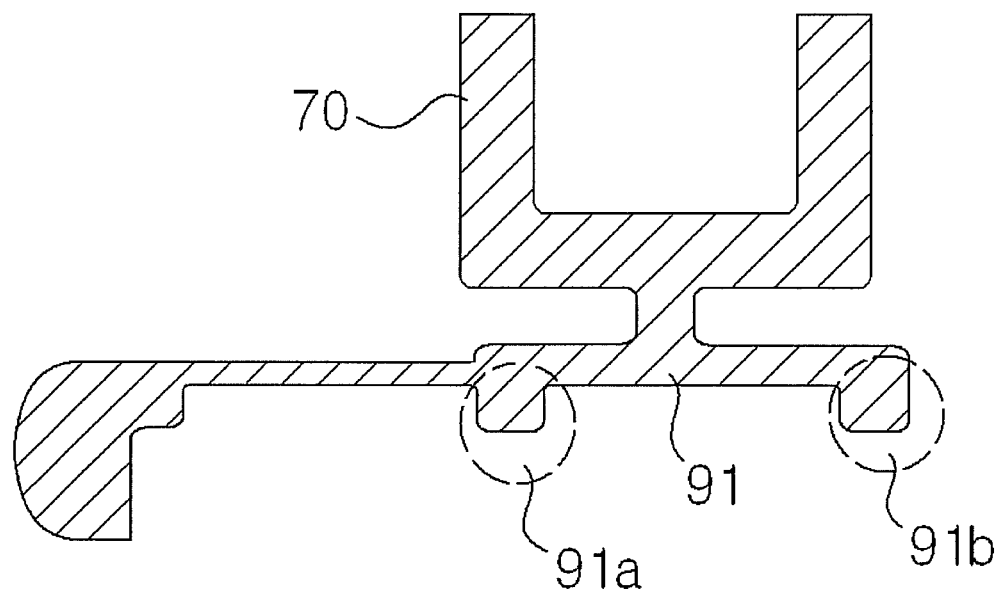
FIG. 5 is a view illustrating a configuration of a second lead frame illustrated in FIG. 1.

FIG. 4 is a view illustrating a configuration of the first lead frame illustrated in FIG. 1, and FIG. 5 is a view illustrating a configuration of the second lead frame illustrated in FIG. 1.

Referring first to FIG. 4, the lower electrode 80 may act to dissipate heat when the light emitting device package is soldered to a printed circuit board (not shown).

Referring to FIG. 5, the upper electrode 70 and the second lead frame 91 may take the form of a metal plate. The upper electrode 70, exposed to the outside of the body 10, may have a U-shaped form suitable to achieve enhanced heat dissipation properties.

Preferably, the first lead frame 92 illustrated in FIG. 4 and the second lead frame 91 illustrated in FIG. 5 are engaged with each other when they are arranged adjacent to each other.

Specifically, the second lead frame 91 and the first lead frame 92 may be arranged one above another such that downwardly protruding protrusion regions 91a and 91b of the second lead frame 91 are engaged into recess regions 92a and 92b of the first lead frame 92.

Figure 6:
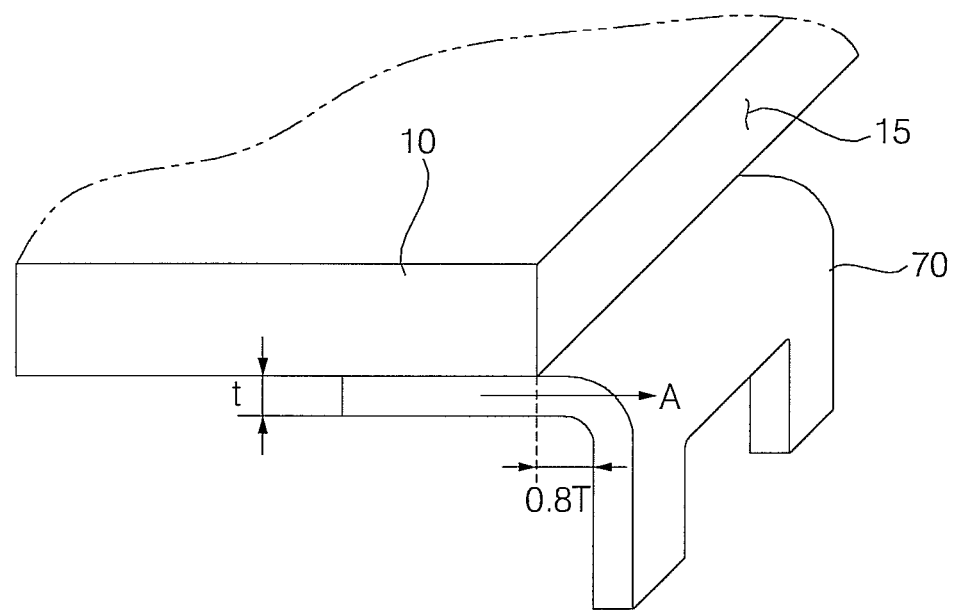
FIG. 6 is a reference view illustrating an arrangement relationship between the body and an upper electrode.
Figure 7:
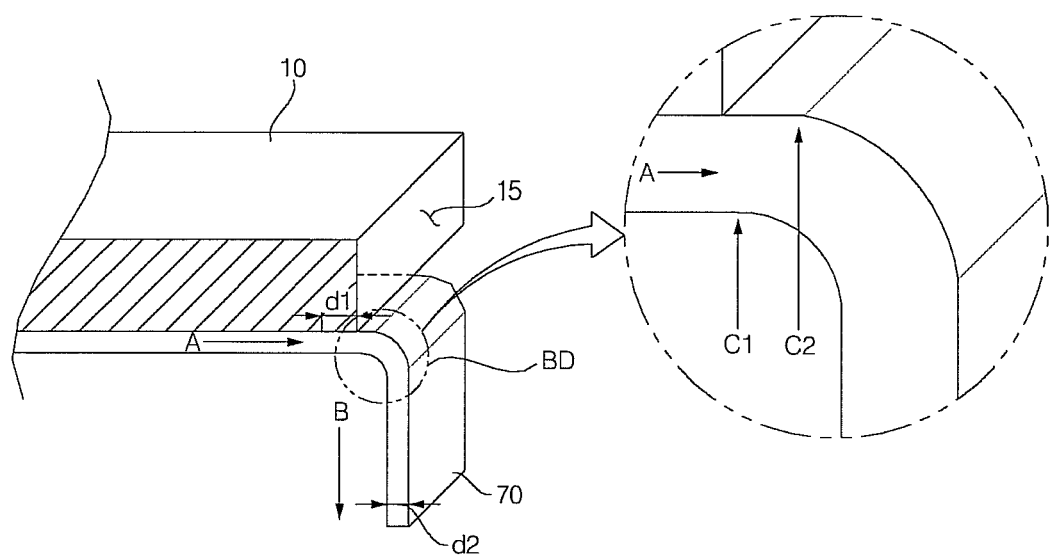
FIG. 7 is a reference view illustrating an arrangement relationship between the body and a lower electrode.

FIG. 6 is a reference view illustrating an arrangement relationship between the body and the upper electrode, and FIG. 7 is a reference view illustrating an arrangement relationship between the body and the lower electrode.

First, referring to FIG. 6, the upper electrode 70 may be extended outward beyond the outer surface 15 in a first direction A by a predetermined length of 0.8 times a thickness t of the upper electrode 70 and thereafter, may be bent to be level with the outer surface 15.

The drawing illustrates the upper electrode 70, which is extended in the first direction A by the predetermined length of 0.8 times the thickness thereof, as being greatly raised outward of the outer surface 15. However, since the thickness of the upper electrode 70 or the lower electrode 80 is in a range of 0.1 mm to 0.3 mm, it seems that the bent upper electrode 70 is substantially level with the outer surface 15 when the upper electrode 70 is extended by the length of 0.8 times, i.e. 80% of the thickness thereof.

Next, referring to FIG. 7, the lower electrode 80 may be extended in the first direction A by a length equal to a thickness d2 thereof and thereafter, may be bent in a second direction B so as to be parallel to an outer surface 14 of the body 10. When the lower electrode 80 begins to be bent in the second direction B at a bending region BD of the body 10, it is preferable that a bending beginning position C1 of an inner surface of the lower electrode 80 be vertically aligned with an edge of the body 10.

But, the bending beginning position C2 of an outer surface 15 of the lower electrode 80 be vertically not aligned with an edge of the body 10.

The bending beginning position C2 of the outer surface 15 of the lower electrode 80 may be changed by the thickness d2.

Or, the bending beginning position C2 provided a groove (not shown), and the groove has a V-shaped or U-shaped form.

This allows the lower electrode 80 to exert minimum shock to the body 10 during bending thereof and to sufficiently underpin the body 10.

If the bending beginning position C1 is inwardly displaced from the edge of the body 10 by a distance d1, a gap occurs at an interface between the body 10 and the lower electrode 80, causing a crack at the corresponding position of the lower electrode 80.

And, a distance (not shown) between the upper electrode 70 and the outer surface 15 is 0.1 times to 0.9 times a thickness of at least one of the upper and the lower electrode 70 and 80.

Or, the distance is equal to the predetermined length.

The crack caused when the lower electrode 80 begins to be bent at position displaced inward of the body 10 will now be described with reference to FIG. 8.

Figure 8:
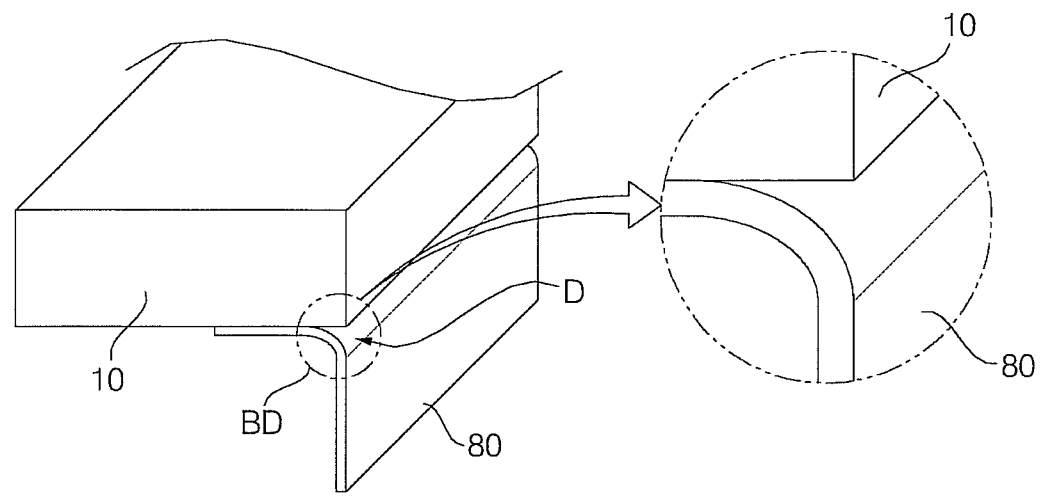
FIG. 8 is a conceptual view illustrating the chance of cracking when the lower electrode is bent at a position inward of the body.

FIG. 8 conceptually illustrates the chance of cracking when the lower body 80 is bent at a position displaced inward of the body 10.

Referring to FIG. 8, when the lower electrode 80 begins to be bent at a position displaced inward of the body 10, a gap D occurs between the lower electrode 80 and the bending region BD of the body 10, which prevents the lower electrode 80 from underpinning the bending region BD of the body 10.

Thus, the bending region BD of the body 10, which is not underpinned by the lower electrode 80, is less resistant to external shock. As the gap D increases, the bending region BD is more and more independent of the lower electrode 80, thereby being much less resistant to external shock.

For this reason, the lower electrode 80 is necessarily configured to underpin the bending region BD of the body 10 without the gap D between the bending region BD and the lower electrode 80.

Figure 9:
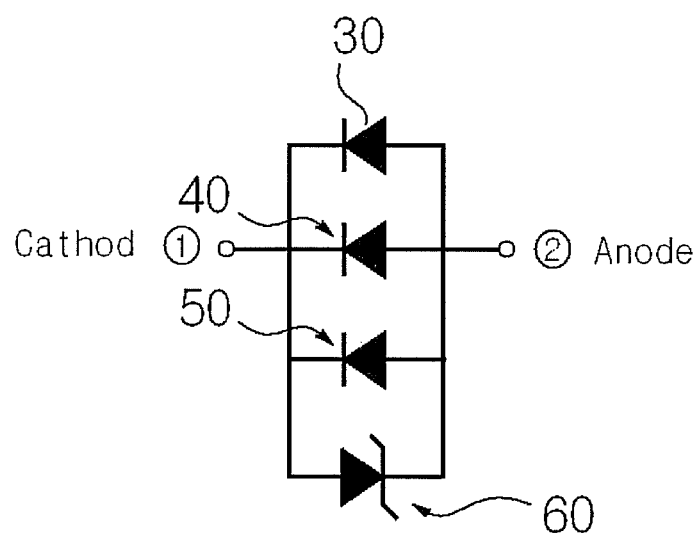
FIG. 9 is a reference view illustrating connection between light emitting devices and an electrostatic discharge (ESD) device.

FIG. 9 illustrates connection between the light emitting device and the ESD device of the light emitting device package in accordance with the embodiment. Here, it is preferable to read the following description of FIG. 9 with reference to FIG. 1 illustrating the light emitting device in accordance with the embodiment in front perspective view.

Referring to FIG. 9, the light emitting device package includes the common anode terminal and the common cathode terminal of the light emitting devices 30, 40 and 50 such that only the two terminals are exposed to the outside of the body 10.

As two terminals of the ESD device 60 are connected to the cathode terminals and the anode terminals of the light emitting devices 30, 40 and 50, it is possible to protect all the light emitting devices 30, 40 and 50 from electrostatic discharge shock.

Although the ESD device 60 is illustrated as being a Zener diode, of course, a Varistor or a TVS diode may be utilized.

The three light emitting devices 30, 40 and 50 and the single ESD device 60, i.e. the four devices are distributed throughout a bottom surface 11 of the body 10. In this case, a distance between the light emitting devices 30, 40 and 50 may be greater than a distance between the light emitting devices illustrated in FIG. 9, which results in less thermal interference between the light emitting devices 30, 40 and 50.

Figure 10:
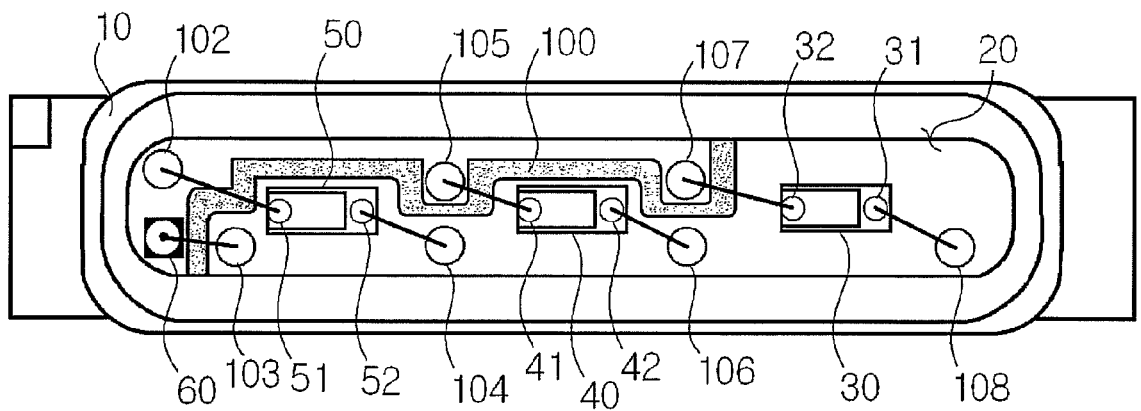
FIG. 10 is a reference view illustrating wiring between the light emitting devices included in the light emitting device package in accordance with the embodiment.

FIG. 10 is a reference view illustrating wiring between the respective light emitting devices included in the light emitting device package in accordance with the embodiment. It is preferable to read the following description of FIG. 10 with reference to FIG. 1.

Referring to FIG. 10, provided on the bottom surface 11 are the second lead frame 91, the first lead frame 92, and the insulating dam 100 to electrically insulate the first lead frame 92 and the second lead frame 91 from each other.

The second lead frame 91 and the first lead frame 92 are made of a thin metal film or a conductive material, so as to electrically connect the light emitting devices 30, 40 and 50 and the ESD device 60 to one another.

The second lead frame 91 and the first lead frame 92 are divided from each other by the insulating dam 100. The second lead frame 91 is connected to the upper electrode 70, whereas the first lead frame 92 is connected to the lower electrode 80.

The second lead frame 91 and the first lead frame 92 are provided with a plurality of pads 102 to 108 to solder the light emitting devices 30, 40 and 50 and the ESD device 60 to the first lead frame 92 and the second lead frame 91.

The pads 102, 105 and 107 are electrically connected to the second lead frame 91, and the pads 103, 104, 106 and 108 are electrically connected to the first lead frame 92.

The second lead frame 91 and the first lead frame 92 are connected to each other via the ESD device 60. The ESD device 60 serves to protect all the light emitting devices 30, 40 and 50 from electrostatic discharge shock.

The pad 102 and the pad 104 are connected respectively to terminals 51 and 52 of the light emitting diode 50, to enable supply of power to anode and cathode terminals of the light emitting diode 50.

The pad 105 and the pad 106 are connected respectively to terminals 41 and 42 of the light emitting diode 40, to enable supply of power to anode and cathode terminals of the light emitting diode 40.

The pad 107 and the pad 108 are connected respectively to terminals 31 and 32 of the light emitting diode 30, to enable supply of power to anode and cathode terminals of the light emitting diode 30.

Here, although a positive voltage and a negative voltage may be applied respectively to the second lead frame 91 and the first lead frame 92, on the contrary, a negative voltage and a positive voltage may be applied respectively to the second lead frame 91 and the first lead frame 92. Polarities of the light emitting devices 30, 40 and 50 may be changed based on polarities of voltages applied to the second lead frame 91 and the first lead frame 92.

For example, if a positive voltage is applied to the second lead frame 91 and a negative voltage is applied to the first lead frame 92, the terminal 51 of the light emitting device 50 serves as an anode terminal and the terminal 52 serves as a cathode terminal. Similarly, the terminals 41 and 42 of the light emitting device 40 respectively serve as an anode terminal and a cathode terminal.

The insulating dam 100 is made of silicon, epoxy, or other non-conductive materials. However, if the second lead frame 91 and the first lead frame 92 are made of metals, the insulating dam 100 may serve to insulate the second lead frame 91 and the first lead frame 92 from each other.

Figure 11:
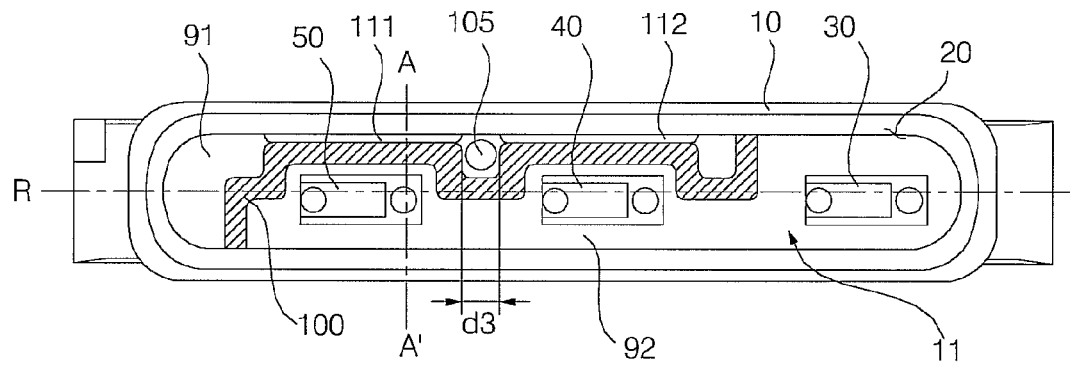
FIG. 11 is a plan view illustrating a second embodiment with respect to the light emitting device package illustrated in FIG. 1.
Figure 12:
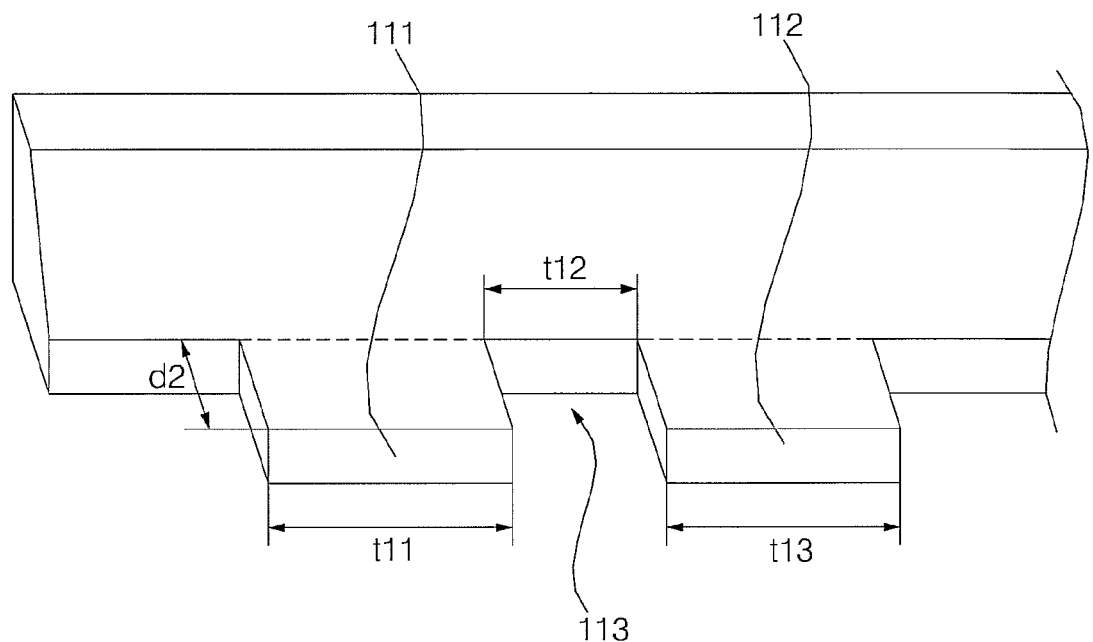
FIG. 12 is a partial perspective view illustrating an inner surface of a body of the light emitting device package illustrated in FIG. 11.

FIG. 11 is a plan view illustrating a second embodiment of the light emitting device package illustrated in FIG. 1, and FIG. 12 is a partial perspective view illustrating an inner surface of the body of the light emitting device package illustrated in FIG. 11.

In FIG. 11, repeated configurations of FIGS. 1 to 3 will not be described or will be briefly described.

1. Referring to FIG. 11, at least one of first and second inner surfaces (not shown) of the body 10 crossing each other, which define the cavity 20 of the body 10, may be provided with first and second extensions 111 and 112 extending inward of the cavity 20.

In the embodiment, the first and second extensions 111 and 112 come into contact with an upper portion of the second lead frame 91. Although the two extensions are described it the embodiment, the number and position of the extensions are not limited thereto.

The upper portion of the second lead frame 91 is attached to the first and second extensions 111 and 112 of the body 10, which allows the second lead frame 91 to be firmly secured to the body 10.

The first and second extensions 111 and 112 may be integrally formed with the body 10 by injection molding, or may be separately prefabricated and then, be coupled to the body 10, although the invention is not limited thereto.

Integrally forming the first extension 111 and the second extension 112 with the body 10 may provide the second lead frame 91 with more firm securing.

When attempting to bond the first extension 111 and the second extension 112, preferably, the first extension 111 and the second extension 112 are bonded to both the body 10 and the second lead frame 91 so as to secure the second lead frame 91 to the body 10.

In this case, the first extension 111 and the second extension 112 may be separated from each other by a distance of 100 μm to 400 μm.

The first extension 111 and the second extension 112 may be further extended respectively toward the light emitting device 50 and the light emitting device 30, so as to improve air tightness of the body 10.

The first extension 111 and the second extension 112 are arranged respectively at left and right sides of the pad 105 provided on the second lead frame 91 and are separated from each other by a distance d3.

That is, the pad 105 is located between the first extension 111 and the second extension 112. To this end, the distance d3 may be equal to the width of an electrode, and for example, may be set to 300 μm. Of course, the distance d3 may be changed based on the size of the electrode and is not limited to the aforementioned value.

With the presence of the first extension 111 and the second extension 112 located at the left and right sides of the pad 105, the second lead frame 91 can firmly come into close contact with the body 10.

In addition, the first extension 111 and the second extension 112 allow the second lead frame 91 to be secured to the body 10 without distortion.

In this case, the first extension 111 and the second extension 112 may be integrally injection molded with the body 10, or may be bonded to the body 10.

Although the embodiment describes the first extension 111 and the second extension 112 as being embedded in the upper region of the second lead frame 91, the first extension 111 and the second extension 112 may be extended into the lower region of the second lead frame 91 so as to be embedded even in a lower end region of the second lead frame 91.

After the first extension 111 and the second extension 112 are embedded in a partial region of the second lead frame 91, a sealing material may be charged into the cavity 20 to isolate the second lead frame 91, the first lead frame 92 and the insulating dam 100 from the outside. The sealing material charged into the cavity 20 may contain a phosphor.

Referring to FIG. 12, the first extension 111 is integrally formed with the body 10 to define a partial outer circumferential surface of the cavity 20 and is embedded in a partial region of the second lead frame 91.

A longitudinal end of the first extension 111, i.e. a distal portion of the first extension 111 protruding toward the second lead frame 91 is illustrated as being perpendicular to the bottom surface 11, the longitudinal end of the first extension 111 may be inclined or stepped with respect to the bottom surface 11.

It is preferable that the widths of the first extension 111 and the second extension 112 be greater than the width of the pad (for example, the pad 105) for connection of the light emitting devices 30, 40 and 50. Also, it is important that the pad 105 is arranged between the first extension 111 and the second extension 112.

Assuming that the width of the second lead frame 91 is "d1" and the width of the first extension 111 embedded in the second lead frame 91 is "d2", the second lead frame 91 can be more firmly secured to the body 10 as the value of d2/d1 increases. However, since increasing the value of d2/d1 may limit an electrode arrangement region of the bottom surface 11, it is preferable to appropriately set the value of d2/d1. The value of d2/d1 may be set to 1 if it has no effect on the arrangement of electrodes.

The first extension 111 and the second extension 111 respectively may have a width t11 and a width t13, and may be separated from each other by a distance t12 required for arrangement of the pad 105.

The first extension 111 and the second extension 112 may protrude from the body 10 by a length d2. The length d2 may be in a range of 10 μm to 100 μm. Of course, the first extension 111 and the second extension 112 may protrude beyond the aforementioned value if a sufficient mount region of the light emitting devices 30, 40 and 50 is guaranteed.

In addition, the first extension 111 and the second extension 112 may be separated from each other by the distance t12 in consideration of the arrangement of the pad 105.

If the pad 105 has a circular shape, the distance t12 is preferably greater than a diameter of the pad 105. If the pad 105 has a rectangular shape, the distance t12 is preferably greater than a length of a longer axis of the pad 105.

The first extension 111 and the second extension 112 are embedded in an upper end region of the second lead frame 91, thereby serving to secure the second lead frame 91 to the body 10. Although not illustrated in the drawing, the first extension 111 and the second extension 112 may also be formed at the first lead frame 92. In this case, the first extension 111 and the second extension 112 may be formed at a lower end of the first lead frame 92.

Figure 13:
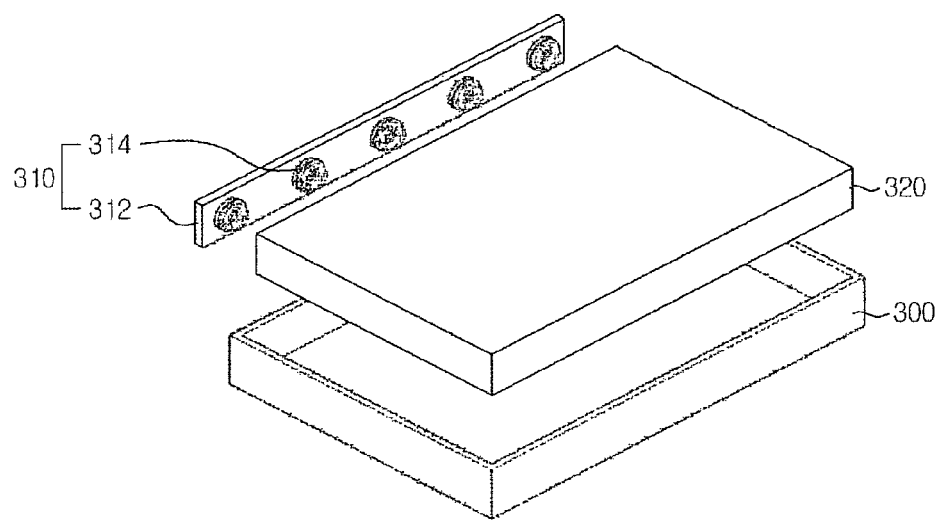
FIG. 13 is a perspective view illustrating a first embodiment of a backlight unit including the light emitting device package in accordance with the embodiment.

FIG. 13 is a perspective view illustrating a first embodiment of a backlight unit including the light emitting device package in accordance with the above described embodiment.

Referring to FIG. 13, the backlight unit may include a lower receiving member 300, a light emitting device module 310 to output light, a light guide plate 320 arranged adjacent to the light emitting device module 310, and a plurality of optical sheets (not shown). The plurality of optical sheets (not shown) may be located on the light guide plate 320.

The light emitting device module 310 may include a plurality of light emitting devices 314 disposed on a printed circuit board 312 to define an array. The printed circuit board 312 may be selected from among a Metal Core Printed Circuit Board (MCPCB), a Flame Retardant composition 4 (FR-4) PCB, and various other PCBs. In addition, the printed circuit board 312 may have a rectangular plate shape, or various other shapes depending on the configuration of a backlight assembly.

The light guide plate 320 converts the light emitted from the light emitting devices 314 into planar light to thereby direct the light to a liquid crystal display panel (not shown). A plurality of optical films (not shown), which serve to realize uniform brightness distribution and enhanced vertical incidence of light directed from the light guide plate 320, and a reflecting sheet (not shown), which reflects light having passed through a rear surface of the light guide plate 320 toward the light guide plate 320, may be located at the rear surface of the light guide plate 320.

Figure 14:
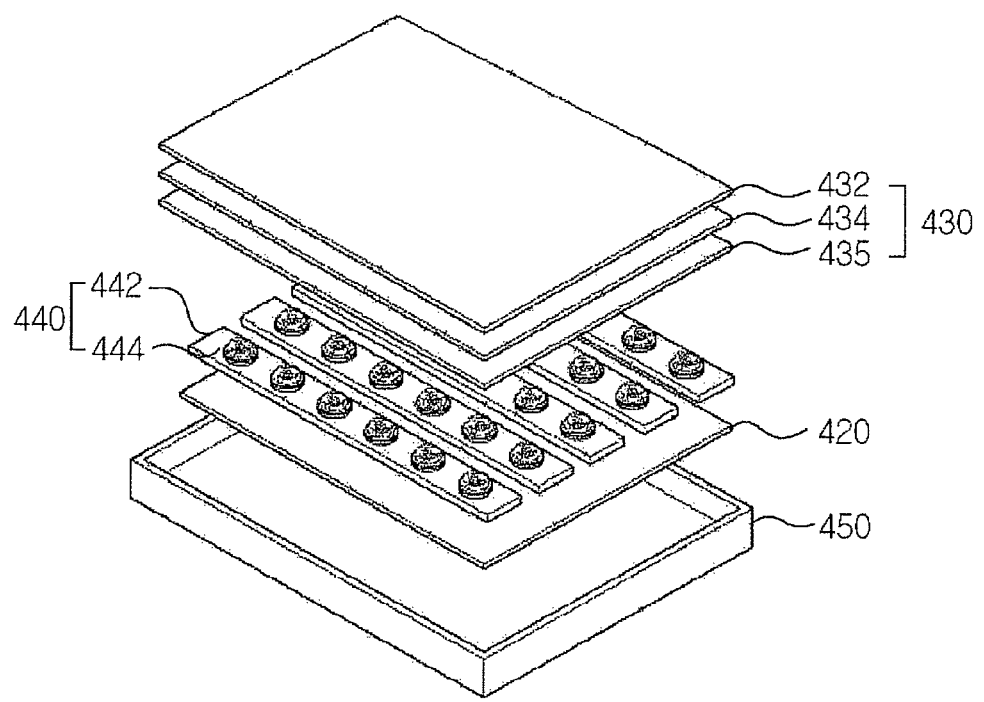
FIG. 14 is a perspective view illustrating a second embodiment of a backlight unit including the light emitting device package in accordance with the embodiment.

FIG. 14 is a perspective view illustrating a second embodiment of a backlight unit including the light emitting device package in accordance with the above described embodiment.

FIG. 14 illustrates a vertical type backlight unit. Referring to FIG. 14, the backlight unit includes a lower receiving member 450, a reflecting plate 420, a plurality of light emitting device modules 440, and a plurality of optical sheets 430.

In this case, each of the light emitting device modules 440 may include a printed circuit board 442 on which a plurality of light emitting devices 444 may be easily disposed to define an array.

Each of the light emitting devices 444 may be provided at a bottom surface thereof with a plurality of bosses, which may improve color mixing effects of red light, green light and blue light when the light emitting devices 444 include light emitting devices to emit red (R), green (G), and blue (B) light respectively so as to create white light. Of course, even when the light emitting devices 444 are adapted to emit only white light, the bosses formed at the bottom surface of the respective light emitting devices 444 may assure uniform light distribution and emission.

The reflecting plate 420 may be made of a high reflectivity material to reduce light loss. The optical sheets 430 may include at least one of a brightness enhancing sheet 432, a prismatic sheet 434, and a diffusive sheet 435.

The diffusive sheet 435 may serve to diffuse light emitted from the light emitting devices 444 to provide the light with uniform brightness distribution over a wide range while directing the light toward a liquid crystal display panel (not shown). The prismatic sheet 434 serves to vertically direct light obliquely incident thereon. Specifically, to vertically direct the light having passed through the diffusive sheet 435, at least one prismatic sheet 434 may be disposed below the liquid crystal display panel (not shown). The brightness enhancing sheet 432 serves to transmit light parallel to a transmission axis thereof while reflecting light perpendicular to the transmission axis.

Figure 15:
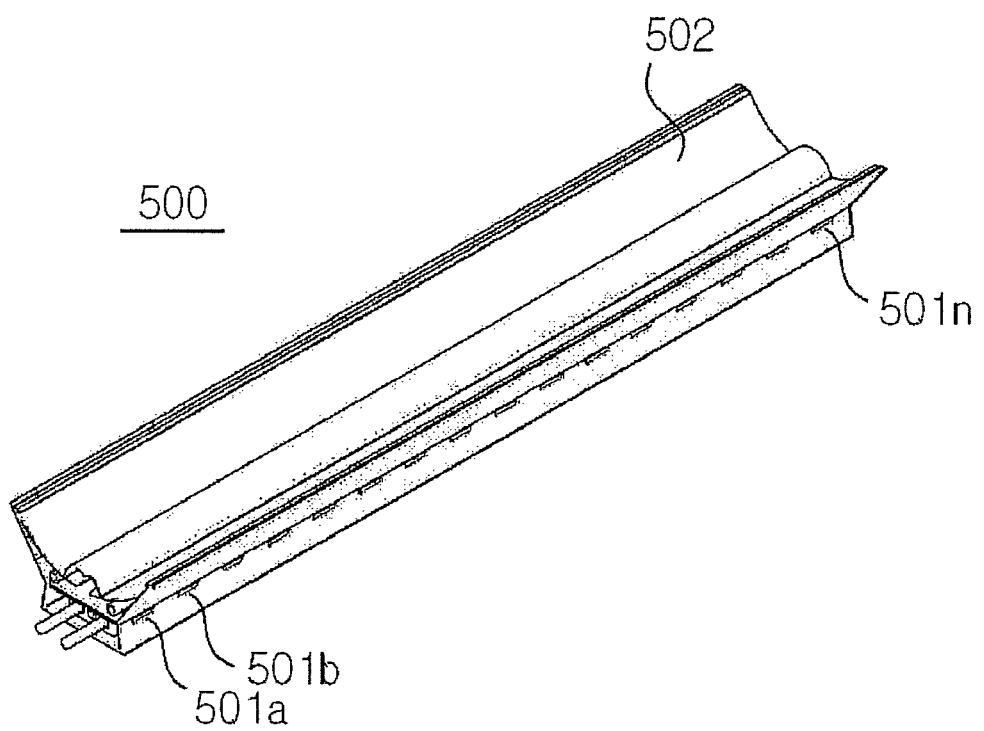
FIG. 15 is a perspective view illustrating a lighting apparatus including the light emitting device package in accordance with the embodiment.

FIG. 15 is a perspective view illustrating a lighting apparatus including the light emitting device package in accordance with the above described embodiment.

Referring to FIG. 15, the lighting apparatus 500 includes a lampshade 502 and light emitting device packages 501a to 501n arranged at a surface of the lampshade 502. Although not illustrated in the drawing, a power device is provided to supply power to the respective light emitting device packages 501 to 501n.

Although FIG. 15 illustrates a fluorescent light type lampshade, of course, the light emitting device in accordance with the embodiment may be applied to a general spiral bulb type, a Fluorescent Parallel Lamp (FPL) type, a halogen lamp type, a metal lamp type and various other types and socket standards, although the invention is not limited thereto.

In the embodiment, the lighting apparatus and the backlight unit illustrated in FIGS. 13 to 15 may be included in a lighting system, and other lighting-oriented apparatuses including the above described light emitting device array may be included in the lighting system, although the invention is not limited thereto.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations. The foregoing description and drawings are, accordingly, to be regarded in an illustrative rather than a restrictive sense.

What is claimed is:

1. A light emitting device package comprising:
a light emitting device including at least one light emitting diode; and
a body including a first lead frame on which the light emitting device is mounted and a second lead frame spaced apart from the first lead frame,
wherein at least one of the first and second lead frames extends to a bending region in a first direction by a predetermined length measured from an outer surface of the body to the bending region and is bent at the bending region in a second direction intersecting the first direction, wherein the predetermined length is 0.7 times to 0.9 times a thickness of at least one of the first and second lead frames,
wherein the first lead frame includes a lower electrode that is exposed to the outside of the body, wherein the second lead frame includes an upper electrode that is exposed to the outside of the body, wherein a partial region of the lower or upper electrode exposed to the outside of the body is bent toward a longitudinal outer surface of the body, wherein the lower electrode is bent toward an edge of the longitudinal outer surface of the body, and wherein the upper electrode is bent toward a middle of the longitudinal outer surface of the body,
wherein the first lead frame includes a recess,
the second lead frame includes a protrusion that protrudes into the recess,
at least one first pad is located adjacent to the recess and the at least one first pad is connected to a first terminal of the light emitting device, at least one second pad is located in the protrusion and the at least one second pad is connected to a second terminal of the light emitting device, wherein at least a part of the second pad overlaps with the first pad, the at least one first pad and the at least one second pad respectively includes a plurality of first pads and a plurality of second pads, and at least one of the plurality of first pads at least partially overlaps with at least one of the plurality of second pads.

2. The light emitting device package of claim 1, wherein at least one of the first and second lead frames includes:

a first surface adjacent to the outer surface; and a second surface opposite to the first surface.

3. The light emitting device package of claim 1, wherein at least one of the first and second lead frames includes:

a first surface adjacent to the outer surface; and a second surface opposite to the first surface, wherein at least a part of the first surface contacts the outer surface.

4. The light emitting device package of claim 1, wherein the thickness of at least one of the first and second lead frames is in a range of 0.1 mm to 0.3 mm.

5. The light emitting device package of claim 1, wherein the bending region of at least one of the first and second lead frames has a bending angle in a range of 30 degrees to 90 degrees.

6. The light emitting device package of claim 1, wherein the body provides a cavity on the first and second lead frames, and the light emitting device package further comprising a resin material formed in the cavity, and wherein the resin material includes at least one of a phosphor and a light diffusive material.

7. The light emitting device package of claim 6, wherein the resin material includes at least two kinds of phosphors.

8. The light emitting device package of claim 6, wherein the resin material has a molding structure having at least two layers.

9. A light emitting device package comprising:

a light emitting device including at least one light emitting diode; and a body including a first lead frame on which the light emitting device is mounted and a second lead frame spaced apart from the first lead frame, wherein at least one of the first and second lead frames extends to a bending region in a first direction by a predetermined length measured from an outer surface of the body and is bent in a second direction intersecting the first direction, and wherein the body provides inner surfaces adjacent to the light emitting device, and at least one of the first and second inner surfaces of the inner surfaces is provided with an extension that extends in a direction toward the light emitting device and contacts an upper portion of at least one of the first and second lead frames, wherein the extension includes a first extension and a second extension spaced apart from the first extension, wherein the first lead frame includes a lower electrode that is exposed to the outside of the body, wherein the second lead frame includes an upper electrode that is exposed to the outside of the body, wherein a partial region of the lower or upper electrode exposed to the outside of the body is bent toward a longitudinal outer surface of the body, wherein the lower electrode is bent toward an edge of the longitudinal outer surface of the body, and wherein the upper electrode is bent toward a middle of the longitudinal outer surface of the body.

10. The light emitting device package of claim 9, wherein the extensions are integrally formed with the body.

11. The light emitting device package of claim 9, wherein a length of the first extension is equal to or greater than a length of the second extension.

12. The light emitting device package of claim 11, wherein a distance between the first extension and the second extension is in a range of 100 μm to 400 μm.

13. The light emitting device package of claim 11, wherein a width of at least one of the first and second extensions is in a range of 10 μm to 100 μm.

14. The light emitting device package of claim 9, wherein a length of the extensions is less than a width of at least one of the first and second lead frames.

15. A lighting system comprising:

a light emitting device package including a light emitting device including at least one light emitting diode and a body including a first lead frame on which the light emitting device is mounted and a second lead frame spaced apart from the first lead frame; and a board on which the light emitting device package is disposed, wherein at least one of the first and second lead frames extends to a bending region in a first direction by a predetermined length measured from an outer surface of the body to the bending region and is bent at the bending region in a second direction intersecting the first direction, wherein the predetermined length is 0.7 times to 0.9 times a thickness of at least one of the first and second lead frames, wherein the first lead frame includes a lower electrode that is exposed to the outside of the body, wherein the second lead frame includes an upper electrode that is exposed to the outside of the body, wherein a partial region of the lower or upper electrode exposed to the outside of the body is bent toward a longitudinal outer surface of the body, wherein the lower electrode is bent toward an edge of the longitudinal outer surface of the body, and wherein the upper electrode is bent toward a middle of the longitudinal outer surface of the body, wherein the body provides inner surfaces adjacent to the light emitting device, and at least one of first and second inner surfaces of the inner surfaces is provided with an extension that extends in a direction toward the light emitting device and contacts an upper portion of at least one of the first and second lead frames, wherein the extension includes a first extension and a second extension spaced apart from the first extension.

16. The light emitting device package of claim 1, wherein the body provides inner surfaces adjacent to the light emitting device, and at least one of first and second inner surfaces of the inner surfaces is provided with an extension that extends in a direction toward the light emitting device and contacts an upper portion of at least one of the first and second lead frames, wherein the extension includes a first extension and a second extension spaced apart from the first extension.

17. The lighting system of claim 15, wherein the first lead frame includes a recess and the second lead frame includes a protrusion that protrudes into the recess.

18. The light emitting device package of claim 9, wherein:

the first lead frame includes a recess; and the second lead frame includes a protrusion that protrudes into the recess.

19. The light emitting device package of claim 18, further comprising:

at least one first pad located adjacent to the recess and the at least one first pad is connected to a first terminal of the light emitting device; and at least one second pad located in the protrusion and the at least one second pad is connected to a second terminal of the light emitting device, wherein at least a part of the second pad overlaps with the first pad.

20. The light emitting device package of claim 19, wherein:

the at least one first pad includes a plurality of first pads and the at least one second pad includes a plurality of second pads; and at least one of the plurality of first pads at least partially overlaps with at least one of the plurality of second pads.

\* \* \* \* \*